United States Patent
Hoehn et al.

(10) Patent No.: US 10,008,392 B2
(45) Date of Patent: Jun. 26, 2018

(54) METHOD FOR PRODUCING A POWER SEMICONDUCTOR MODULE

(71) Applicant: Infineon Technologies AG, Neubiberg (DE)

(72) Inventors: Alexander Hoehn, Soest (DE); Georg Borghoff, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/424,995

(22) Filed: Feb. 6, 2017

(65) Prior Publication Data

US 2017/0148644 A1    May 25, 2017

Related U.S. Application Data

(62) Division of application No. 14/925,274, filed on Oct. 28, 2015.

(30) Foreign Application Priority Data

Oct. 30, 2014 (DE) .................. 10 2014 115 847

(51) Int. Cl.
*H01L 21/48* (2006.01)
*H01L 21/52* (2006.01)
(Continued)

(52) U.S. Cl.
CPC ...... *H01L 21/4817* (2013.01); *H01L 21/4853* (2013.01); *H01L 21/4885* (2013.01);
(Continued)

(58) Field of Classification Search
CPC . H01L 21/50; H01L 21/4885; H01L 21/4853; H01L 22/49894; H01L 23/3735;
(Continued)

(56) References Cited

U.S. PATENT DOCUMENTS 5,825,085 A * 10/1998 Masumoto ............. H01L 23/06
257/698
5,920,119 A    7/1999 Tamba et al.
(Continued)

FOREIGN PATENT DOCUMENTS

DE    102006051454 A1    9/2007
DE    102011075154 A1    11/2011
(Continued)

*Primary Examiner* — Jasmine Clark
(74) *Attorney, Agent, or Firm* — Murphy, Bilak & Homiller, PLLC

(57) ABSTRACT

A power semiconductor module is produced by: providing an electrically conductive terminal block having a screw thread, a connecting conductor having first and second sections, a module housing, a circuit carrier having a dielectric insulation carrier and an upper metallization layer on an upper side of the insulation carrier, and a semiconductor component; fitting the semiconductor component on the circuit carrier; producing a firm and electrically conductive connection between the terminal block and the connecting conductor at the first section; producing a material-fit and electrically conductive connection between the circuit carrier or the semiconductor component and the connecting conductor at the second section; and arranging the terminal block and the circuit carrier fitted with the semiconductor component on the module housing so the semiconductor component is arranged in the module housing and the screw thread is accessible from an outer side of the module housing.

19 Claims, 4 Drawing Sheets

(51) Int. Cl.
    *H01L 23/053*    (2006.01)
    *H01L 23/08*     (2006.01)
    *H01L 23/373*    (2006.01)
    *H01L 23/498*    (2006.01)
    *H05K 5/00*     (2006.01)

(52) U.S. Cl.
    CPC ............ *H01L 21/52* (2013.01); *H01L 23/053* (2013.01); *H01L 23/08* (2013.01); *H01L 23/3735* (2013.01); *H01L 23/49811* (2013.01); *H01L 23/49838* (2013.01); *H01L 23/49894* (2013.01); *H05K 5/0008* (2013.01)

(58) Field of Classification Search
    CPC ............... H01L 23/4006; H01L 23/053; H01L 23/49811; H01L 23/49838; H01L 23/49894; H01L 23/08; H01L 21/52; H05K 5/0008
    See application file for complete search history.

(56) References Cited

U.S. PATENT DOCUMENTS

| | | |
|---|---|---|
| 6,060,772 A | 5/2000 | Sugawara et al. |
| 6,521,983 B1 | 2/2003 | Yoshimatsu et al. |
| 7,589,412 B2 | 9/2009 | Kashimoto et al. |
| 8,736,043 B2 | 5/2014 | Konno et al. |

FOREIGN PATENT DOCUMENTS

| | | |
|---|---|---|
| DE | 102011087353 A1 | 6/2012 |
| DE | 102012212119 A1 | 1/2013 |
| JP | 2011108817 A | 6/2011 |

\* cited by examiner

METHOD FOR PRODUCING A POWER SEMICONDUCTOR MODULE

PRIORITY CLAIM

This application is a Divisional of U.S. application Ser. No. 14/925,274 filed on 28 Oct. 2015, which in turn claims priority to German Patent Application No. 10 2014 115 847.4 filed on 30 Oct. 2014, the content of both of said applications incorporated herein by reference in their entirety.

TECHNICAL FIELD

The present invention relates to a power semiconductor module and to a method for producing a power semiconductor module.

BACKGROUND

Power semiconductor modules require electrical terminals for their electrical contacting external to the module. To this end, in conventional semiconductor modules, terminal plates are often used which have a foot region at which they are soldered to a circuit carrier of the semiconductor module, and a terminal region which protrudes out of the module housing. Because of the heat capacity of such terminal plates, the soldering of the foot regions entails strong thermal loading of the circuit carrier, which may have the effect that the circuit carrier, and/or an electrical component with which the circuit carrier is pre-fitted, can be damaged or destroyed.

Another problem with the electrical terminals of semiconductor modules is their inductances. When the electrical terminals are used, for example, to deliver a control signal, for example a gate drive voltage, to a controllable semiconductor switch (for example an IGBT, a MOSFET etc.) installed in the semiconductor module, switching faults may occur because of the inductance of the electrical terminals, which lead to the controllable semiconductor switch being switched on or off late or early.

Instead of terminal plates, single terminal pins are also often used, which respectively have a first end that is arranged inside a module housing, and a second end that is routed out of the module housing. The first ends are connected inside the module housing to a metallization of the circuit carrier, while the second ends are connected to a printed circuit board external to the module. In order to connect the second ends to the printed circuit board external to the module, the second ends are often fitted into corresponding contact openings of the printed circuit board. To this end, the printed circuit board is pressed onto the second ends protruding from the module housing, although this requires correspondingly high forces which are transmitted via the terminal pins onto the circuit carrier. These forces cause mechanical stress of the circuit carrier, by which the circuit carrier may be damaged. Furthermore, the second ends need to be positioned relative to one another with high accuracy, so that they are aligned with their contact openings during mounting of the printed circuit board on the semiconductor module. Such precise positioning, however, entails great outlay. For example, after the actual fabrication of the semiconductor module the alignment of the second ends needs to be checked, and if appropriate corrected by bending, since otherwise the printed circuit board cannot be mounted. A similar problem arises when the module housing has a housing cover with openings, through which the terminal pins need to be passed. Besides all this, mounting of the individual terminal pins on the circuit carrier is also highly elaborate, since they respectively need to be positioned individually at a predetermined position of the circuit carrier, and connected thereto there.

Furthermore, the electrical connection inside the module of the electrical terminals requires a great deal of space for corresponding connecting lines. On the one hand, the semiconductor module contains a multiplicity of other elements, for example bonding wires or busbars, so that detours need to be taken into account in the routing of the connecting lines, and on the other hand the connecting lines also need to comply with minimum distances from other elements of the semiconductor module, for example in order to avoid voltage spark-over and leakage currents.

SUMMARY

A power semiconductor module is provided which has at least one electrical terminal that can be produced in a straightforward way and without the risk of destroying constituents of the semiconductor module, and which can be electrically connected in a straightforward way. A method for producing such a semiconductor module also is provided.

According to an embodiment of a power semiconductor module, the power semiconductor module comprises a module housing, a circuit carrier, a semiconductor component and an electrically conductive terminal block. The circuit carrier has a dielectric insulation carrier and an upper metallization layer, which is applied onto an upper side of the dielectric insulation carrier. The semiconductor component is arranged on the circuit carrier. The terminal block is connected firmly and electrically conductively by a connecting conductor to the circuit carrier and/or to the semiconductor component, and has a screw thread that is accessible from the outer side of the module housing.

According to an embodiment of a method for producing a power semiconductor module, an electrically conductive terminal block having a screw thread, a connecting conductor with a first section and a second section, and a module housing are provided. The circuit carrier has a dielectric insulation carrier and an upper metallization layer, which is applied onto an upper side of the dielectric insulation carrier. The semiconductor component is fitted on the circuit carrier, and a firm and electrically conductive connection is produced between the terminal block and the connecting conductor at its first section. Furthermore, a material-fit and electrically conductive connection is produced between the circuit carrier or the semiconductor component and the connecting conductor at its second section. The terminal block and the circuit carrier fitted with the semiconductor component are arranged on the module housing in such a way that the semiconductor component is arranged in the module housing and the screw thread is accessible from the outer side of the module housing.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
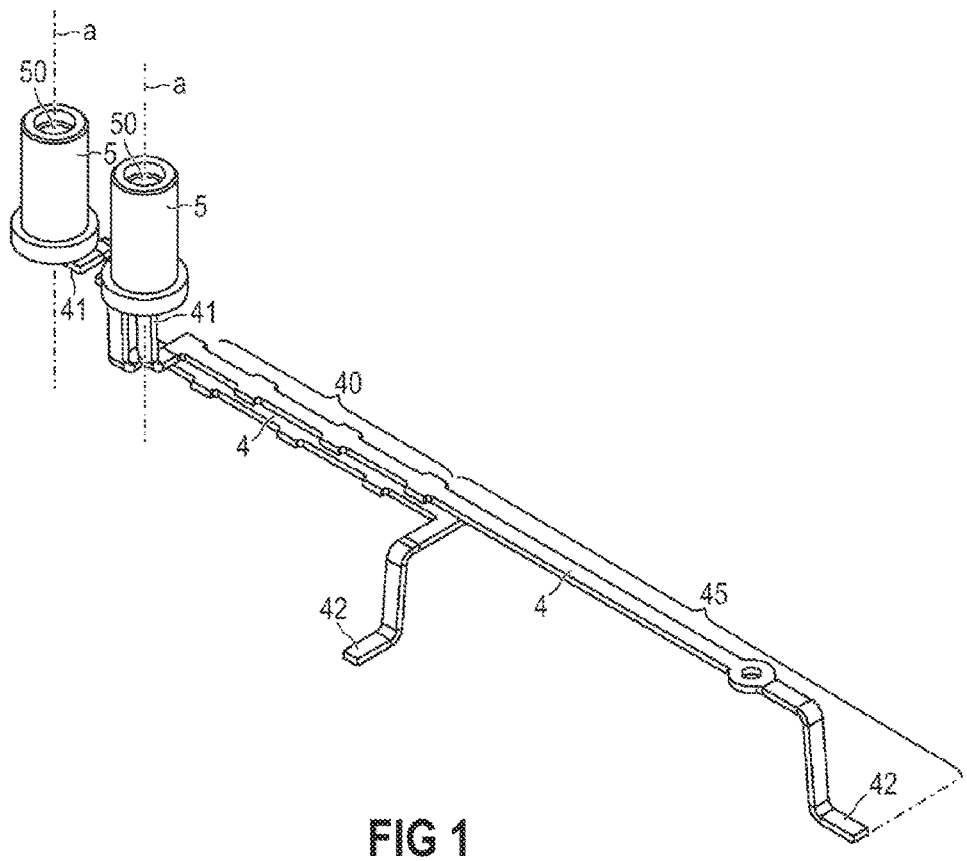
FIG. 1 shows a perspective view of two terminal blocks respectively having a screw thread, which are respectively connected with a material fit and electrically conductively to a connecting conductor.

FIG. 1 shows a perspective view of two electrically conductive terminal blocks 5. Each of the terminal blocks 5 has a screw thread 50, here merely by way of example an internal screw thread, with a screw thread axis a. Furthermore, for each of the terminal blocks 5 there is a connecting conductor 4 with a first section 41 and a second section 42. At its first section 41, each connecting conductor 4 is connected firmly and electrically conductively at a first connecting position to the associated terminal block 5. The first connecting position may for example be on the side of the terminal block 5 facing away from the screw thread 50, although it may also be at other positions.

The connection between a terminal block 5 and a connecting conductor 4 may be with a material fit, and for example configured as a soldered connection (hard or soft soldered connection) or as a welded connection (for example produced by laser welding). In the case of a soldered connection, the solder used touches both the connecting conductor 4 and the terminal block 5, and in the case of a welded connection the connecting conductor 4 touches the terminal block 5.

The connection between a terminal block 5 and a connecting conductor 4 may, however, also be configured as a riveted connection, and produced for example by the orbital riveting method. To this end, the connecting conductor 4 is fitted at its first section 41 of the lower side facing away from the internal screw thread into a prefabricated bore or other opening of the terminal block 5, so that a free end of the connecting conductor 4, formed at the first section 41, protrudes into a further bore of the terminal block 5, which forms the opening of the or for the internal screw thread. The internal screw thread may be formed in the region of the further bore before or after carrying out the orbital riveting method.

Before producing the connection between a terminal block 5 and a connecting conductor 4, the connecting conductor 4 may be pre-bent to match a predetermined structure of a semiconductor module in which it is subsequently installed. To this end, the connecting conductor 4 may for example be stamped from a metal sheet and subsequently bent into a desired final shape, which it ultimately has when it is installed in the semiconductor module.

In principle, the connection between a terminal block 5 and the connecting conductor 4 may be produced before or after the connecting conductor 4 is bent, but also between two bending steps in which the connecting conductor 4 is respectively bent.

Figure 2:
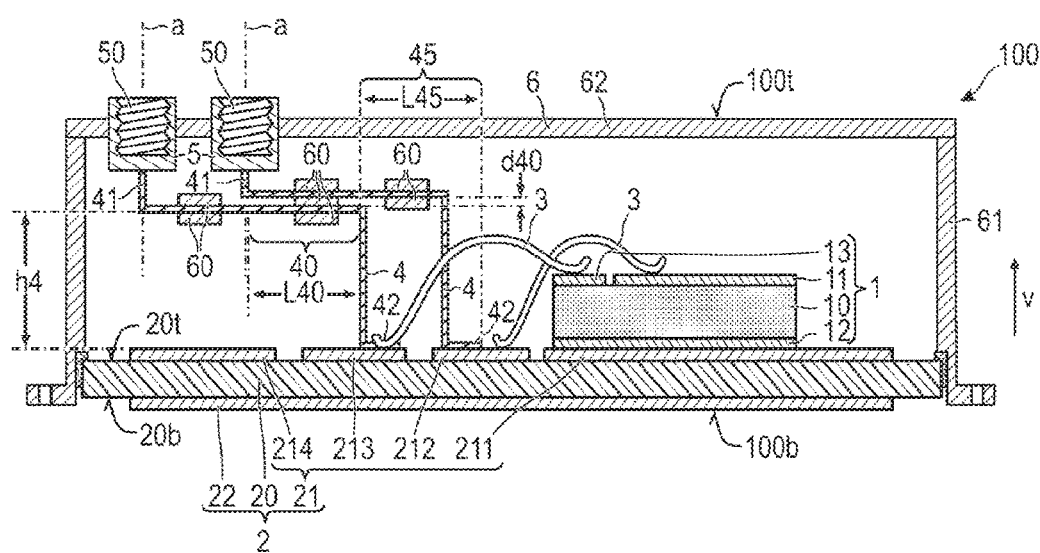
FIG. 2 shows a cross section through a semiconductor module which contains two terminal blocks respectively having an internal screw thread, each of which is connected by means of a connecting conductor with a material fit and electrically conductively to a circuit carrier.

The second section 42 is used to connect the respective connecting conductor 4 electrically and mechanically to an element of a semiconductor module 100, for example a circuit carrier 2 or a semiconductor chip 1. A corresponding connection may, for example, be produced by soldering, by sintering a paste containing metal powder (for example a paste which contains a silver powder), by welding or by electrically conductive adhesive bonding with a conductive adhesive. As an example of this, FIG. 2 shows a cross section through a semiconductor module 100.

The semiconductor module 100 has an electrically insulating module housing 6, and a circuit carrier 2 which is connected with a material fit to the module housing 6, for example by adhesive bonding.

The module housing 6 may for example contain a housing frame 61 and a housing cover 62 which is fitted onto the housing frame 61.

The circuit carrier 2 has a dielectric insulation carrier 20 with an upper side 20$t$, onto which an upper metallization layer 21 is applied, and an optional lower metallization layer 22 which is applied onto a lower side 20$b$, facing away from the upper side 20$t$, of the dielectric insulation carrier. If there are an upper and a lower metallization layer 21, 22, these may therefore lie on opposite sides of the insulation carrier 20 from one another. The upper metallization layer 21 may if necessary be structured, so that it has sections 211, 212, 213, 214 which may, for example, be used for electrical interconnection and/or for chip mounting. The dielectric insulation carrier 20 may be used to insulate the upper metallization layer 21 and the lower metallization layer 22 electrically from one another.

The circuit carrier 2 may be a ceramic substrate, in which the insulation carrier 20 is formed as a thin layer that comprises ceramic or consists of ceramic. Electrically highly conductive metals, for example copper or copper alloys, aluminum or aluminum alloys, but also any other desired metals or alloys, are suitable as materials for the upper metallization layer 21 and, if present, the lower metallization layer 22. If the insulation carrier 20 comprises ceramic or consists of ceramic, the ceramic may, for example, be aluminum oxide ($Al_2O_3$) or aluminum nitride (AlN) or silicon nitride ($Si_3N_4$) or zirconium oxide ($ZrO_2$), or a mixed ceramic which besides at least one of the aforementioned ceramic materials also comprises a further ceramic material different thereto. For example, a circuit carrier 2 may be configured as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate). The upper metallization layer 21 and, if present, the lower metallization layer 22 may independently of one another respectively have a thickness in the range of from 0.05 mm to 2.5 mm. The thickness of the insulation carrier 20 may, for example, lie in the range of from 0.1 mm to 2 mm. Thicknesses greater or less than those indicated are, however, likewise possible.

The circuit carrier 2 may be fitted with one or more electronic parts. In principle, any desired electronic parts 1 may be used. In particular, such an electronic part 1 may contain any desired active or passive electronic component. It is also possible for one or more active electronic components and one or more passive electronic components to be integrated together in an electronic part 1. Each electronic part 1 has a first electrode 11 and at least one second electrode 12.

For example, an electronic part 1 may be configured as a semiconductor chip and comprise a semiconductor body 10. The electrodes 11 and 12 may then respectively be a chip metallization, which is applied onto the semiconductor body 10.

A part 1 may for example contain a diode, or a controllable semiconductor switch, which can be driven via a control input 13 (for example a gate or base input), for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor). The first electrode 11 and the second electrode 12 of a part 1 may for example be the anode and cathode, cathode and anode, source and drain, drain and source, emitter and collector, or collector and emitter of the relevant component.

In the illustrated example, the part 1 is connected at the second electrode 12 with a material fit and electrically conductive connection to a section 211 of the upper metallization layer 21. The corresponding connection may for example be produced by soldering, sintering a paste containing metal powder (for example a paste which contains a silver powder), or by electrically conductive adhesive bonding. Depending on the requirements of the circuit to be produced on the circuit carrier 2, the one electronic part 1 may be connected in any desired way to the circuit carrier 2 and/or to other elements of the power semiconductor module to be produced. In FIG. 2, merely as an example of this, a bonding wire 3 is shown which is bonded by wire bonding at a first bonding position to a section 212 of the upper metallization layer 21, and at a second bonding position to the first electrode 11 of the part 1.

So that the electronic circuit produced on the circuit carrier 2 can be electrically contacted from the outer side of the semiconductor module 100, that is to say from the outer side of the module housing 6, with the aid of screw connections, one or more terminal blocks 5 are used, the screw thread 50 of which is respectively accessible from the outer side of the module housing 6. The screw thread 50, here merely by way of example an internal screw thread, may for example be used to screw a printed circuit board, a solid metal busbar, a ribbon conductor, a terminal lug, etc. to the terminal block 5 by using the screw thread 50.

As shown with the aid of the semiconductor module 100 represented in FIG. 2, the electrical connection inside the module between the terminal block 5 and the circuit produced on the circuit carrier 2 may be carried out by using a connecting conductor 4 which, as was explained with reference to FIG. 1, is connected firmly and electrically conductively at its first section 41 to the terminal block 5 and electrically conductively at its second section 42 to the circuit produced on the circuit carrier 2.

A connecting carrier 4 may be connected at its second section by in principle any desired connection technique electrically conductively to the circuit produced on the circuit carrier 2. In the example shown, the connecting conductors 4 are respectively connected at their second section 42 to a section of the upper metallization layer 21 of the circuit carrier 2. These connections may for example be configured as material-fit connections, for example as soldered connections, as adhesive connections using an electrically conductive adhesive, as a welded connection (for example produced by laser welding or by ultrasound welding). In the case of a soldered or adhesive connection, a solder or a conductive adhesive which touches both the second section 42 and the upper metallization layer 21 is used as connecting means.

It is likewise possible, for example, to connect a connecting conductor 4 at its second section 42 in the same way to the first electrode 11 of the part 1 instead of to the upper metallization layer 21.

As likewise represented in FIG. 2, a first terminal block 5 (of the two terminal blocks 5 represented, the one on the left) may be electrically connected in the manner explained by means of a first connecting conductor 4 to the control input 13, which in the present case is carried out merely by way of example via a section 213 of the upper metallization layer 21 and a bonding wire 3, while a second terminal block 5 (of the two terminal blocks 5 represented, the one on the right) is electrically connected by means of a second connecting conductor 4, likewise in the manner explained, to the load terminal of the part 1, which during operation of the semiconductor module 100 has the reference potential for driving. As shown in the present case, this load terminal may be the first load terminal 11. This is connected electrically conductively, and merely by way of example by means of a bonding wire 3, to a section 212 of the upper metallization layer 21, to which the second section 42 of the second connecting conductor 4 is also fastened. The second terminal block 5 may for example represent an auxiliary terminal for driving the part 1, for example an auxiliary emitter terminal.

In order to produce a semiconductor module 100, a unit having a terminal block 5 and a connecting conductor 4, which is connected firmly and electrically conductively at its first section to the terminal block 5 as explained with reference to FIG. 1, may be prefabricated.

Furthermore, the circuit carrier 2 may optionally be pre-fitted with one or more electronic components 1 and then connected to the housing 6 or to a housing frame 61 or a housing side wall. Subsequently, the prefabricated unit having the terminal block 5 and the connecting conductor 4 connected thereto may be connected electrically conductively to the circuit produced on the circuit carrier 2, for example by the connecting conductor 4 being soldered, welded or electrically conductively adhesively bonded at its second section 42 to the upper metallization layer 21 or the first electrode 11, as explained.

In order for the second section 42 of the connecting conductor 4 to be at the correct position before it is connected to the circuit, the unit having the connecting conductor 4 and the terminal block 5 may be fastened to the housing 6 or a housing part (for example the housing frame 61 or a housing side wall) in such a way that the second section 42 of the connecting conductor 4 reaches the correct target position when the pre-fitted circuit carrier 2 is applied on the housing 6 or the housing part, so that it is then only necessary to produce the connection between the second section and the circuit, without further positioning of the second section 42 relative to the circuit (i.e. relative to the predetermined fastening position) having to be carried out.

The fastening of the unit having the connecting conductor 4 and the terminal block 5 to the housing 6 or to the housing part may be carried out by fitting (for example clipping) the unit into a holder 60 of the prefabricated housing 6 or the prefabricated housing part, or equally molded into the housing 6 or the housing part (by injection molding) during the production thereof, so that the housing 6 or the housing part has an integrated holder 60. With the aid of a corresponding number of holders 60, it is possible to pre-fit a housing 6 or a housing part with two or more units, each of which has a terminal block 5 and a connecting conductor 4 connected to the latter.

In order to achieve low-inductance conductor routing in the case of two or more such units, two sections of connecting conductors 4 of different units may be routed in parallel with one another over a path 40, as shown by way of example in FIG. 1 which shows two such units in the arrangement which they have in the finished semiconductor module 100, as well as in FIG. 2 and the subsequent figures. The path 40 may for example have a length L40 of at least 30 mm, for example about 33 mm. In this case, the length L40 is to be determined in the extent direction of the sections routed in parallel and centrally between them. The sections routed in parallel may extend in a straight line and/or with a curvature. If there are curvatures, the length L40 is also to be determined along the curvatures. In the region of the path 40, the sections routed in parallel have a spacing d40. This may, for example, be selected to be less than or equal to 5 mm, less than or equal to 1 mm, or even less than or equal to 0.5 mm. By the explained parallel routing in sections, a part 1 can be provided with a control voltage, applied between the terminal blocks 5 of the two units, for driving the part 1 with a low inductance and with low error susceptibility.

In one or both of the units in which two sections of the connecting conductors 4 are routed in parallel, the respective connecting conductor 4 may, at its side facing away from the terminal block 5 of the same unit, have a section 45 which follows on from the path section 40. For this section 45, the connecting conductor 4 of the other unit does not have a section routed in parallel therewith, so that there is an increased inductance. It is therefore advantageous to keep the section 45 as short as possible. For example, each position of the section 45 may not be more than a distance L45 away from the path section 40 in any direction parallel to the upper side 20t. The distance L45 may, for example, be selected to be less than 37 mm or even less than 2 mm.

According to yet another aspect, in order to achieve low-inductance routing of a connecting conductor 4, it is advantageous for it to have a section extending parallel to the upper side 20t, which may for example have a length of at least 30 mm, and the distance h4 of which from the upper metallization layer 21 is less than or equal to 9 mm. This criterion may apply not only for a connecting conductor 4 of a single unit, but also in particular for the connecting conductors 4 of two units with parallel-routed sections of their connecting conductors 4 for each of the sections routed in parallel.

Figure 3:
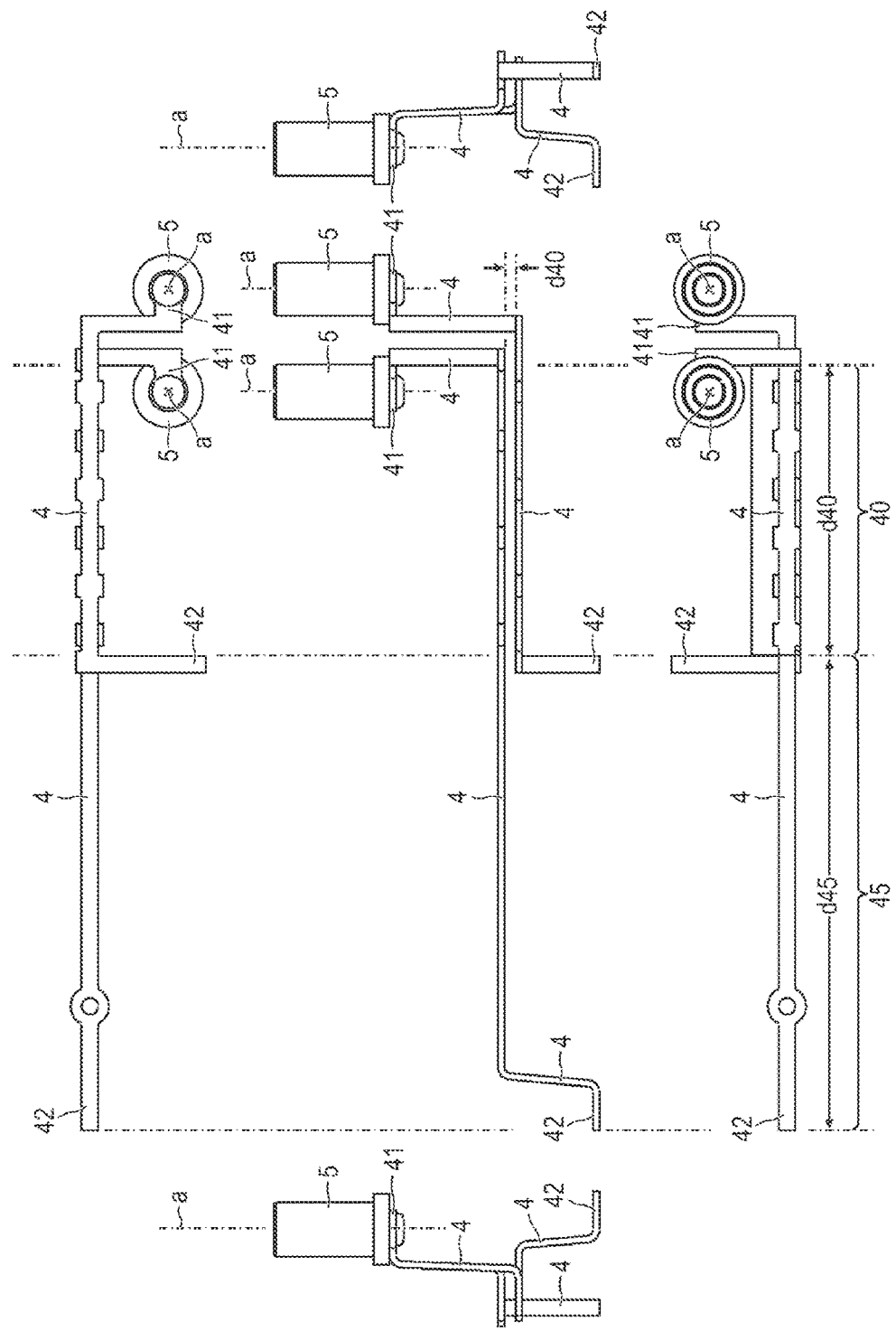
FIG. 3 shows various views of the two terminal blocks represented in FIG. 1 and respectively connected with a material fit and electrically conductively to a connecting conductor.

FIG. 3 shows further views of the two units already represented in FIG. 1, likewise in the arrangement with respect to one another which they have in the finished semiconductor module 100.

Figure 4A:
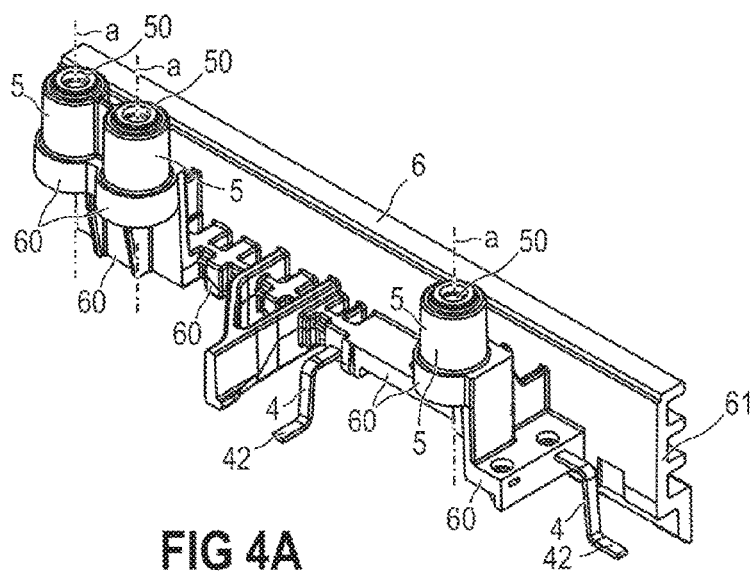
FIG. 4A shows a perspective view from above of a section of a module housing, into which the connecting conductors shown in FIGS. 1 and 3 are molded.
Figure 4B:
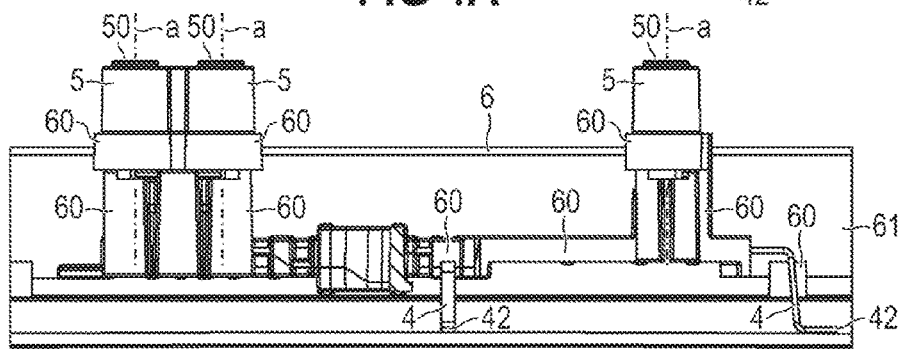
FIG. 4B shows a side view of the arrangement according to FIG. 4A.
Figure 4C:
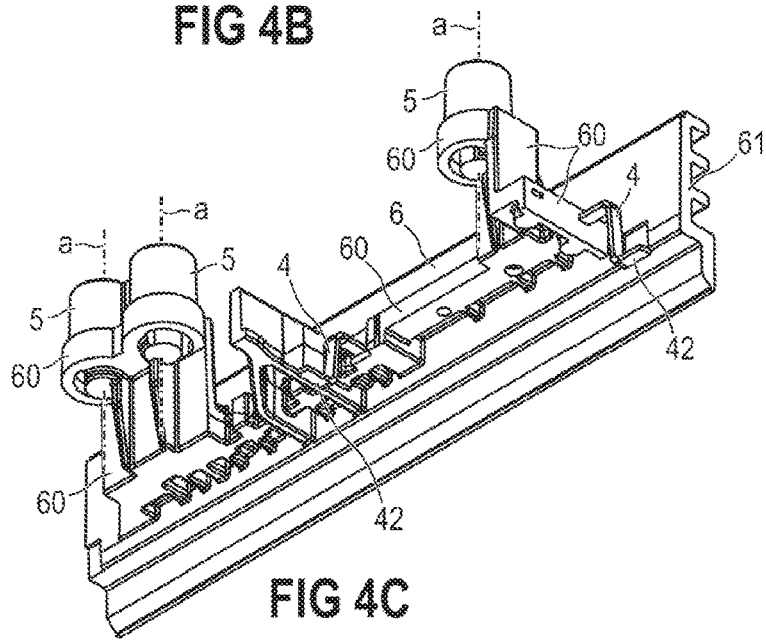
FIG. 4C shows a perspective view from below of the arrangement according to FIG. 4A.

FIGS. 4A, 4B and 4C show a perspective view from above, a side view and a perspective view from below of the same section of a module housing 6 with a side wall 61, on which the two units explained with the aid of FIGS. 1 and 3 are fastened with the aid of holders 60, as explained above.

Figure 5:
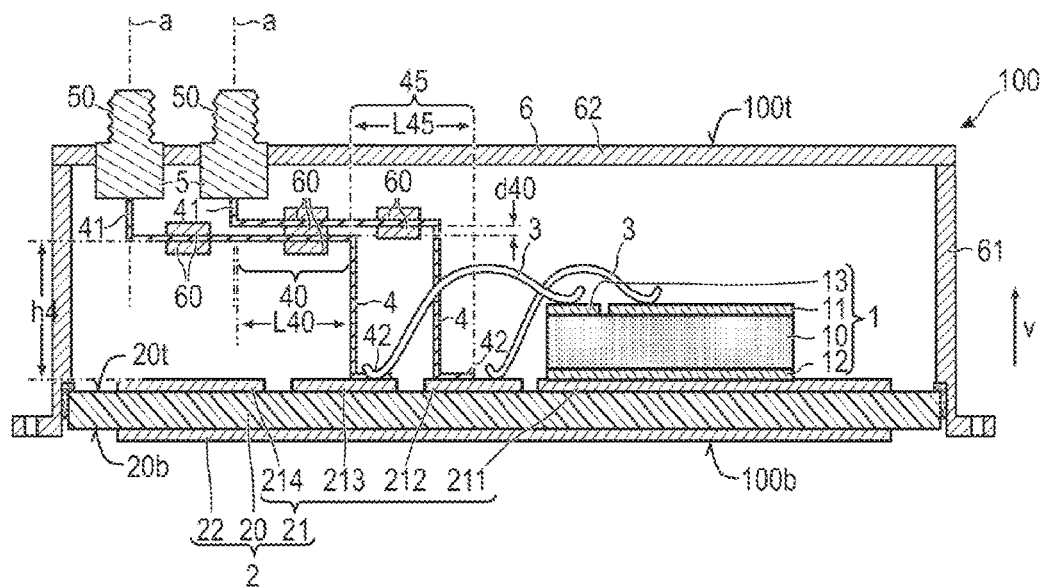
FIG. 5 shows a cross section through a semiconductor module which contains two terminal blocks respectively having an external screw thread, each of which is connected by means of a connecting conductor with a material fit and electrically conductively to a circuit carrier.

Although the screw threads 50 of the terminal blocks 5 were configured as internal screw threads in the examples above, they may however likewise be configured as external screw threads. An example of this is shown with the aid of a semiconductor module 100 represented in FIG. 5, the structure of which in other regards corresponds to that of the semiconductor module 100 according to FIG. 2. Of course, it is also possible to use in a semiconductor module 100 at least one terminal block 5 whose screw thread 50 is configured as an internal screw thread, and at least one further terminal block 5 whose screw thread 50 is configured as an external screw thread.

In principle, in the present invention it is advantageous for the terminal blocks 5 and the connecting conductors 4 to have a high electrical conductivity. For example, a terminal block 5 may consist of copper alloys or have a proportion of at least 90% by weight copper. A terminal block 5 may likewise consist of other materials or comprise other materials. Examples of suitable materials are lead-free brass (for example CuZn39Pb3), machining brass, stainless steel (for example of DIN EN 10088-3 X8CrNiS18-9), steel (including nickel-plated), or bronze (for example CuSn6 or CuPb1P). A connecting conductor 4 may consist of metal, for example of copper or a copper alloy, and/or have a proportion of at least 90% by weight copper.

In all variants of the invention, the screw thread axis 'a' of the screw thread may optionally extend perpendicularly to the upper side 20t of the insulation carrier 20.

Figure 6:
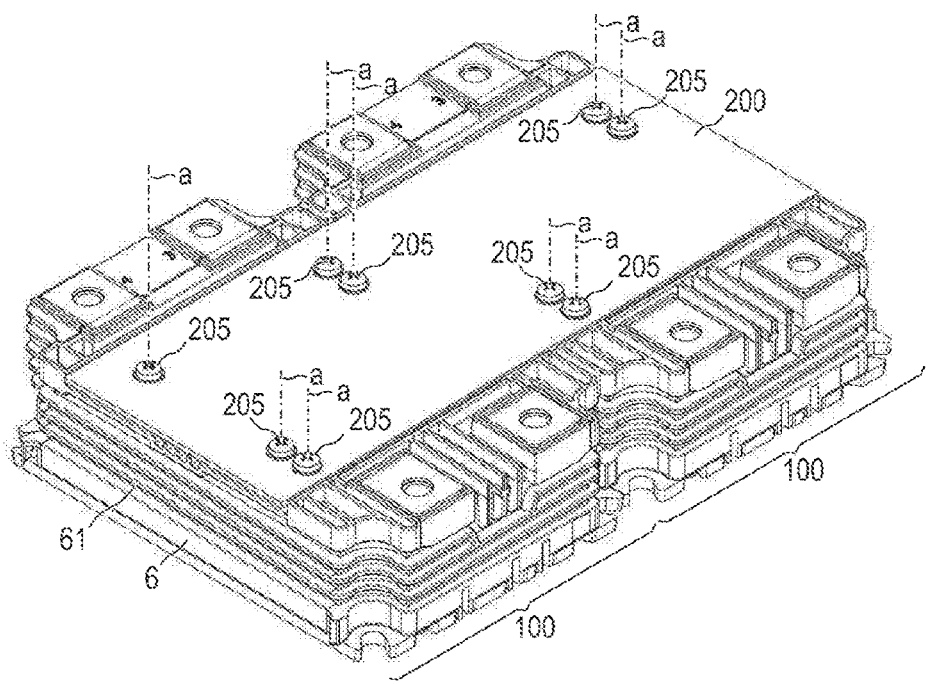
FIG. 6 shows a perspective view from above of two semiconductor modules, each of which contains a plurality of terminal blocks having an internal screw thread, onto which a circuit board is screwed and is thereby electrically conductively connected to the semiconductor modules.

FIG. 6 also shows a perspective view of two semiconductor modules 100, on which a circuit board 200 is placed and, for each of the semiconductor modules 100, is mechanically and electrically connected to the relevant semiconductor module 100 at a plurality of terminal blocks 5 by using connecting screws 205, which are respectively screwed into the internal screw thread of a terminal block. In a corresponding way, naturally, it would also be possible to connect only a single semiconductor module 100 to a circuit board 200. In the semiconductor modules 100 represented, the screw threads 5 are respectively configured as internal screw threads. In principle, in a semiconductor module 100, however, in one, several or all of its terminal blocks 5 the screw thread 50 could also be configured as an external screw thread. If a circuit board 200 is screwed together with a terminal block 5 whose screw thread 50 is an external screw thread, a screw nut which is screwed onto the external screw thread is used instead of a connecting screw 205.

Instead of a circuit board 200, a semiconductor module 100 may in a similar way be screwed together with, and thereby electrically connected to, a metal busbar, a ribbon conductor or a screw lug.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a power semiconductor module, the method comprising:
providing an electrically conductive terminal block having a screw thread;
providing a connecting conductor having a first section and a second section;
providing a module housing;
providing a circuit carrier having a dielectric insulation carrier and an upper metallization layer applied onto an upper side of the dielectric insulation carrier;
providing a semiconductor component;
fitting the semiconductor component on the circuit carrier;
producing a firm and electrically conductive connection between the terminal block and the connecting conductor at the first section of the connecting conductor;
producing a material-fit and electrically conductive connection between the circuit carrier or the semiconductor component and the connecting conductor at the second section of the connecting conductor;
arranging the terminal block and the circuit carrier fitted with the semiconductor component on the module housing in such a way that the semiconductor component is arranged in the module housing and the screw thread is accessible from an outer side of the module housing,
wherein the module housing or a part of the module housing is produced by injection molding, while being provided with a holder into which the connecting conductor is placed after the production of the module housing or the part of the module housing.

2. The method of claim 1, further comprising:
providing an electrically conductive further terminal block having a further screw thread that is accessible from the outer side of the module housing;
providing a further connecting conductor having a further first section and a further second section;
producing a firm and electrically conductive connection between the further terminal block and the further connecting conductor at the further first section;
producing a material-fit and electrically conductive connection between the circuit carrier and/or the semiconductor component and the further connecting conductor at the further second section; and
routing the connecting conductor and the further connecting conductor in parallel over a length of at least 30 mm.

3. The method of claim 2, further comprising:
spacing the connecting conductor and the further connecting conductor by a distance of at most 5 mm in the region in which they are routed in parallel.

4. The method of claim 1, wherein producing the firm and electrically conductive connection between the terminal block and the connecting conductor at the first section of the connecting conductor comprises soldering, welding, laser-welding or riveting the connecting conductor to the terminal block at the first section.

5. The method of claim 1, wherein producing the material-fit and electrically conductive connection between the circuit carrier or the semiconductor component and the connecting conductor at the second section of the connecting conductor comprises soldering, sintering, welding, ultrasound-welding or electrically conductively adhesively bonding the connecting conductor to the circuit carrier or to the semiconductor component at the second section.

6. The method of claim 1, wherein the screw thread has a screw-thread axis which extends perpendicularly to the upper side of the dielectric insulation carrier.

7. The method of claim 1, wherein providing the terminal block comprises forming the terminal block in one piece.

8. A method for producing a power semiconductor module, the method comprising:
providing an electrically conductive terminal block having a screw thread;
providing a connecting conductor having a first section and a second section;
providing a module housing;
providing a circuit carrier having a dielectric insulation carrier and an upper metallization layer applied onto an upper side of the dielectric insulation carrier;
providing a semiconductor component;
fitting the semiconductor component on the circuit carrier;
producing a firm and electrically conductive connection between the terminal block and the connecting conductor at the first section of the connecting conductor;
producing a material-fit and electrically conductive connection between the circuit carrier or the semiconductor component and the connecting conductor at the second section of the connecting conductor;
arranging the terminal block and the circuit carrier fitted with the semiconductor component on the module housing in such a way that the semiconductor component is arranged in the module housing and the screw thread is accessible from an outer side of the module housing;
providing an electrically conductive further terminal block having a further screw thread that is accessible from the outer side of the module housing;
providing a further connecting conductor having a further first section and a further second section;
producing a firm and electrically conductive connection between the further terminal block and the further connecting conductor at the further first section;
producing a material-fit and electrically conductive connection between the circuit carrier and/or the semiconductor component and the further connecting conductor at the further second section;
routing the connecting conductor and the further connecting conductor in parallel over a length of at least 30 mm.

9. The method of claim 8, further comprising:
spacing the connecting conductor and the further connecting conductor by a distance of at most 5 mm in the region in which they are routed in parallel.

10. The method of claim 8, wherein producing the firm and electrically conductive connection between the terminal block and the connecting conductor at the first section of the connecting conductor comprises soldering, welding, laser-welding or riveting the connecting conductor to the terminal block at the first section.

11. The method of claim 8, wherein producing the material-fit and electrically conductive connection between the circuit carrier or the semiconductor component and the connecting conductor at the second section of the connecting conductor comprises soldering, sintering, welding, ultrasound-welding or electrically conductively adhesively bonding the connecting conductor to the circuit carrier or o the semiconductor component at the second section.

12. The method of claim 8, wherein the screw thread has a screw-thread axis which extends perpendicularly to the upper side of the dielectric insulation carrier.

13. The method of claim 8, wherein providing the terminal block comprises forming the terminal block in one piece.

14. The method of claim 8, wherein the connecting conductor and the module housing are provided by producing the module housing by injection molding while molding the connecting conductor into the module housing.

15. The method of claim 8, wherein the module housing or a part of the module housing is produced by injection molding, while being provided with a holder into which the connecting conductor is placed after the production of the module housing or the part of the module housing.

16. A method for producing a power semiconductor module, the method comprising:
   providing an electrically conductive terminal block having a screw thread;
   providing a connecting conductor having a first end section disposed at a first level, a second end section disposed at a second level below the first level, and a middle section disposed at a third level between the first and the second levels;
   providing a module housing;
   providing a circuit carrier having a dielectric insulation carrier and an upper metallization layer applied onto an upper side of the dielectric insulation carrier;
   providing a semiconductor component;
   fitting the semiconductor component on the circuit carrier;
   producing a firm and electrically conductive connection between the terminal block and the connecting conductor at the first end section of the connecting conductor;
   producing a material-fit and electrically conductive connection between the circuit carrier or the semiconductor component and the connecting conductor at the second end section of the connecting conductor;
   arranging the terminal block and the circuit carrier fitted with the semiconductor component on the module housing in such a way that the semiconductor component is arranged in the module housing and the screw thread is accessible from an outer side of the module housing,
   wherein the first end section of the connecting conductor is spaced apart from the semiconductor component and the circuit carrier after the firm and electrically conductive connection is formed between the terminal block and the connecting conductor at the first end section of the connecting conductor.

17. The method of claim 16, wherein the module housing or a part of the module housing is produced by injection molding, while being provided with a holder into which the connecting conductor is placed after the production of the module housing or the part of the module housing.

18. The method of claim 16, further comprising:
   providing an electrically conductive further terminal block having a further screw thread that is accessible from the outer side of the module housing;
   providing a further connecting conductor having a further first end section disposed at a fourth level, a further second end section disposed at a fifth level below the fourth level, and a further middle section disposed at a sixth level between the fourth and the fifth levels;
   producing a firm and electrically conductive connection between the further terminal block and the further connecting conductor at the further first end section;
   producing a material-fit and electrically conductive connection between the circuit carrier and/or the semiconductor component and the further connecting conductor at the further second end section;
   routing the connecting conductor and the further connecting conductor in parallel over a length of at least 30 mm.

19. The method of claim 18, wherein the further first end section of the further connecting conductor is detached from the semiconductor component and the circuit carrier after the firm and electrically conductive connection is formed between the further terminal block and the further connecting conductor at the further first end section of the further connecting conductor.

* * * * *